US008598646B2

(12) United States Patent
Chen et al.

(10) Patent No.: US 8,598,646 B2
(45) Date of Patent: Dec. 3, 2013

(54) NON-VOLATILE FINFET MEMORY ARRAY AND MANUFACTURING METHOD THEREOF

(75) Inventors: Chun Chen, San Jose, CA (US); Shenqing Fang, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 210 days.

(21) Appl. No.: 13/006,339

(22) Filed: Jan. 13, 2011

(65) Prior Publication Data
US 2012/0181591 A1 Jul. 19, 2012

(51) Int. Cl.
*H01L 27/105* (2006.01)
(52) U.S. Cl.
USPC ............. 257/314; 257/E21.561; 257/E27.081
(58) Field of Classification Search
USPC ........................... 257/314, E21.561, E27.081
See application file for complete search history.

(56) References Cited

U.S. PATENT DOCUMENTS 7,504,689 B2 * 3/2009 Hisamoto et al. ............. 257/324

* cited by examiner

*Primary Examiner* — Long Pham
(74) *Attorney, Agent, or Firm* — Sterne, Kessler, Goldstein & Fox P.L.L.C.

(57) ABSTRACT

An electronic device includes a substrate with a semiconducting surface having a plurality of fin-type projections coextending in a first direction through a memory cell region and select gate regions. The electronic device further includes a dielectric isolation material disposed in spaces between the projections. In the electronic device, the dielectric isolation material in the memory cell regions have a height less than a height of the projections in the memory cell regions, and the dielectric isolation material in the select gate regions have a height greater than or equal to than a height of the projections in the select gate regions. The electronic device further includes gate features disposed on the substrate within the memory cell region and the select gate regions over the projections and the dielectric isolation material, where the gate features coextend in a second direction transverse to the first direction.

11 Claims, 7 Drawing Sheets

200

NON-VOLATILE FINFET MEMORY ARRAY AND MANUFACTURING METHOD THEREOF

BACKGROUND OF THE INVENTION

1. Statement of the Technical Field

The invention is directed to the field of memory devices in electronic systems, and more particularly, to non-volatile memory devices in electronic systems.

2. Description of the Related Art

The need to retain cost and performance competitiveness in the production of metal-oxide-semiconductor field effect transistor (MOSFET) devices, and particularly MOSFET-based memory devices, has driven the increase in device density in integrated circuits. As a result, new technologies are constantly needed in order to allow the feature size of these devices to be reduced and therefore allow the device density to be increased. This is generally referred to as device "scaling". Unfortunately, as non-volatile MOSFET-based memory devices are scaled, such devices suffer from several problems. In particular, interactions between the channel and source/drains of these devices may degrade the ability of the gate of the same to control whether the device is on or off. This phenomenon is generally referred to as "short-channel effects". Further, the reduction of design features makes it difficult for such memory device to meet data retention requirement, e.g., a ten year data retention requirement.

One proposed solution for addressing the above-mentioned issues with non-volatile MOSFET-based memory device is the use of FINFET structures. That is, rather that using the conventional horizontal arrangement for a channel in a non-volatile MOSFET-based memory device, the channel is instead formed by providing a vertical semiconductor or "fin". As a result, the gate electrode effectively surrounds the channel and all regions of the channel is influenced by the gate electrode. Therefore, because charge flow can be more effectively inhibited between a source and a drain when the transistor is turned off, it may be possible to reduce power consumption. Additionally, since a portion of the channel is vertically oriented, a FINFET non-volatile memory cell can be formed with a foot print of a smaller, horizontal device. However, the increased channel length provided by the vertical fin allows the reduced size FINFET memory cell to retain the data retention characteristics of larger devices.

BRIEF DESCRIPTION OF THE DRAWINGS

Non-limiting and non-exhaustive embodiments of the invention are described with reference to the following drawings, in which.

DETAILED DESCRIPTION

Figure 1:
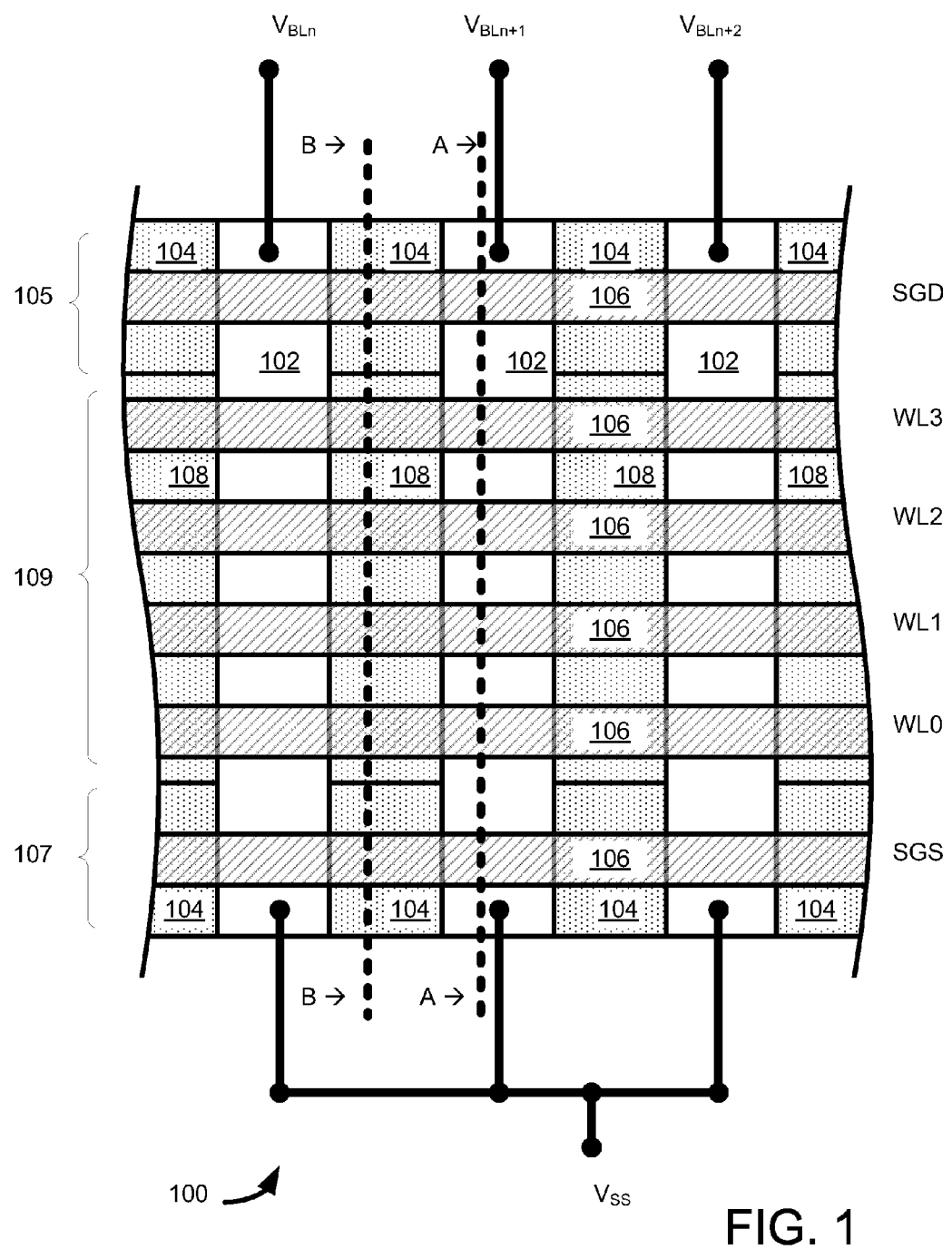
FIG. 1 is a top view of a portion of a NAND-type memory array fabricated in accordance with an embodiment of the invention.

The invention is described with reference to the attached figures, wherein like reference numbers are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

The word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances.

Briefly stated, embodiments of the invention are related to methods for manufacturing electronic devices including memory cell devices and systems thereof. As described above, one method of providing high density non-volatile memory arrays that are not significantly affected by short channel effects and that provide acceptable data retention times is the use of FINFET memory cells. However, one major difficultly arising in conventional non-volatile FINFET memory cells is excessive gate induced drain leakage (GIDL).

GIDL currents are typically the result of a high electric field in the gate/drain overlap region of a MOS transistor. In particular, GIDL occurs when the voltage at the gate of the MOS transistor is substantially lower than the voltage in the overlapped drain region of the MOS transistor. The resulting electric field in this region causes carriers to move from the drain to the substrate or vice versa, resulting in a leakage current. These carriers can originate from traps in the high field region or can be the result of band-to-band tunneling.

In the case of FINFET devices, such GIDL is substantially enhanced by the fin-type shape of the channel. In a typical FINFET MOS transistor, a device is formed when a fin-type active area is overlapped by a gate electrode feature extending in a substantially transverse direction. The overlapping portions of the gate electrode feature typically extend over a portion of the both the top of the fin-type active region and abutting portions of the sidewalls of the fin-type active region. As a result, the resulting electric fields in the fin-type active area in portions of the channel region where the top and sidewall portions meet include substantial vertical and horizontal components. Consequently, a significant increase in the overall electric field occurs in these areas, resulting in enhanced GIDL.

In NAND-type memory arrays, bias conditions resulting in significant GIDL typically occur during the NAND program operation. During the NAND program operation, the source selective gate and the drain selective gate associated with memory cells for a same bitline are typically biased to a low voltage, such as 0V. In contrast, the wordlines for the memory cells are biased to relatively high channel boost voltage, typically 10 to 30 volts. As a result, programming of these memory cells is accomplished via Fowler-Nordheim tunneling of electrons from the channel. However, the program operation also generally increases the voltage in the channel regions of the memory cells. Further, because an inversion layer is formed for each cell, the various inversion regions couple source/drain regions of the memory cells together, thus increasing the voltage of the source/drain regions between the select gate and edge wordlines. Accordingly, the increased voltage in the source/drain regions associated with the selective gate transistor can lead to GIDL currents, as described above.

In a NAND-type memory array, GIDL currents are problematic for several reasons. First, GIDL currents can generate hot electrons that can disturb the edge memory cells. Further, GIDL currents can also reduce the channel boost voltages, leading to NAND-array program operation disturb and incorrect programming of the memory cell. As a result, when FINFET devices are used to form a memory array, such memory arrays may be prone to more errors than conventional planar NAND memory arrays.

To overcome the limitations of conventional FINFET memory arrays, the various embodiments of the invention provide a new FINFET memory array in which GIDL-induced errors are significantly reduced or eliminated. In particular, a combination of planar and FINFET devices is used in the same memory array to form select gate and memory cell devices, respectively. An exemplary configuration of such a memory array is illustrated in FIG. 1.

FIG. 1 is a top view of a portion of a NAND-type memory array 100 fabricated in accordance with an embodiment of the invention. As shown in FIG. 1, memory array 100 includes a plurality of active areas 102 coextending in a first direction separated by dielectric isolation regions 104. The term "coextending", as used herein, refers to objects of features that extend in a same direction and are parallel or substantially parallel (±10 degrees difference) to each other. The memory array 100 also includes a plurality of gate features 106 coextending in a second direction substantially transverse to the first direction.

In memory array 100, gate features 106 are arranged to overlap active areas 102 to define a series of MOS transistors (i.e., the memory cells 109) in each of active areas 102. Each series thus forms a chain of NAND memory cells accessible via select gates and bit lines. For example, as shown in FIG. 1, a first of gate features 106 defines a drain select gate (SGD) line defining drain select devices 105, a last of gate features 106 defines a source select gate (SGS) line defining source select devices 107, and the gate features therebetween define wordlines (WL0-WL4) for the memory cells 109 for the memory array 100. The source regions of the source select devices 107 can be coupled to a common voltage Vss, as shown in FIG. 1. The drain regions of the drain select devices 105 can be coupled to bitlines ( . . . , $V_{BLn}$, $V_{BLn+1}$, $V_{BLn+2}$, . . . ), where each of the chains is coupled to a different one of the bitlines.

In the embodiment illustrated in FIG. 1, only a limited number of bitlines and wordlines are shown. However, this is for illustrative purposes only. The various embodiments of the invention are equally applicable to a memory arrays having any number of bitlines and/or wordlines.

In the various embodiments of the invention, the memory cells 109 are configured as FINFET devices, to provide scaling of the memory array 100, and devices 105 and 107 are configured as planar devices, to reduce GIDL in the memory array 100. In memory array 100, this configuration is accomplished by forming active areas 102 as a series of coextending fin-type projections. The term "fin-type", as used herein, refers to objects having a width that is less than a height of the object and less than a length of the object. The trenches formed between such fin-type projections can be substantially filled with a dielectric material to form dielectric isolation regions 104 between the active areas 102. To define the FINFET memory cells 109, recesses 108 are provided in dielectric isolation regions 104 adjacent to memory cells 109. The recesses 108 result in the sidewalls of active areas 102 being exposed during processing. As a result, the gate features 106 for memory cells 109 can thereafter be formed that extend over both the top and sidewall portions of active areas 102, thus forming FINFET devices. However, since no recess regions are provided for the portions of dielectric isolation regions 104 adjacent to devices 105 and 107, the gate features are formed only on the top of active areas 102. Accordingly, devices 105 and 107 provide planar devices.

In the various embodiments of the invention, the linewidth and/or spacing of gate features 106 can be the same or different. For example, since devices 105 and 107 are configured as planar devices in the various embodiments of the invention, such devices may need to have a linewidth and/or spacing greater than that of devices 109 to properly operate. Additionally, a pitch or spacing for devices 105 and 107 may also need to be greater than that for devices 109.

The configuration described above in FIG. 1 results in a memory array 100 with significantly fewer GIDL-induced errors while still preserving the size and operational advantages of FINFET-type memory arrays. In particular, since the source select and drain select devices are planar devices instead of FINFET devices, the enhanced GIDL typically observed during NAND program operations is reduced or eliminated. Further, since the memory cells are configured as FINFET devices in the various embodiments of the invention and such FINFET memory cells will comprise the bulk of the devices in the memory array, any increase in select gate devices needed for proper operation of the memory array will not significantly increase the size of the memory array.

Figure 2:
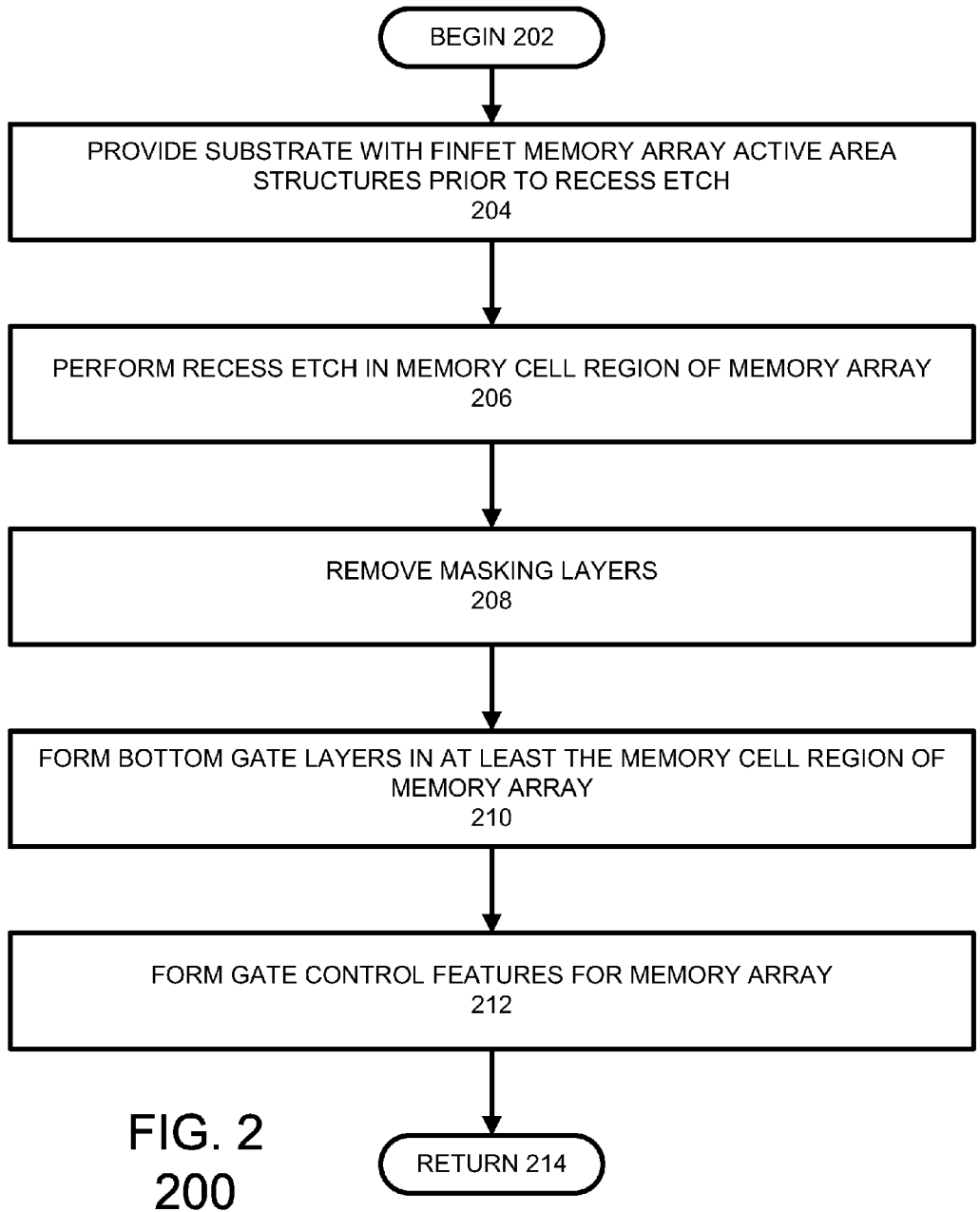
FIG. 2 is a flowchart of steps in an exemplary method for fabricating a NAND-type FINFET memory array in accordance with an embodiment of the invention.

In the various embodiments of the invention, the structure in FIG. 1 can be formed by significantly modifying the conventional recess process for a FINFET memory array. An exemplary process is described below with respect to FIG. 2 and FIGS. 3A-6B. FIG. 2 is a flowchart of steps in an exemplary method for fabricating a NAND-type FINFET memory array in accordance with an embodiment of the invention. FIGS. 3A-7B are side views of the memory array in FIG. 1 along cutline A-A and cutline B-B, respectively, at various points in the process shown in FIG. 2.

Figure 3A:
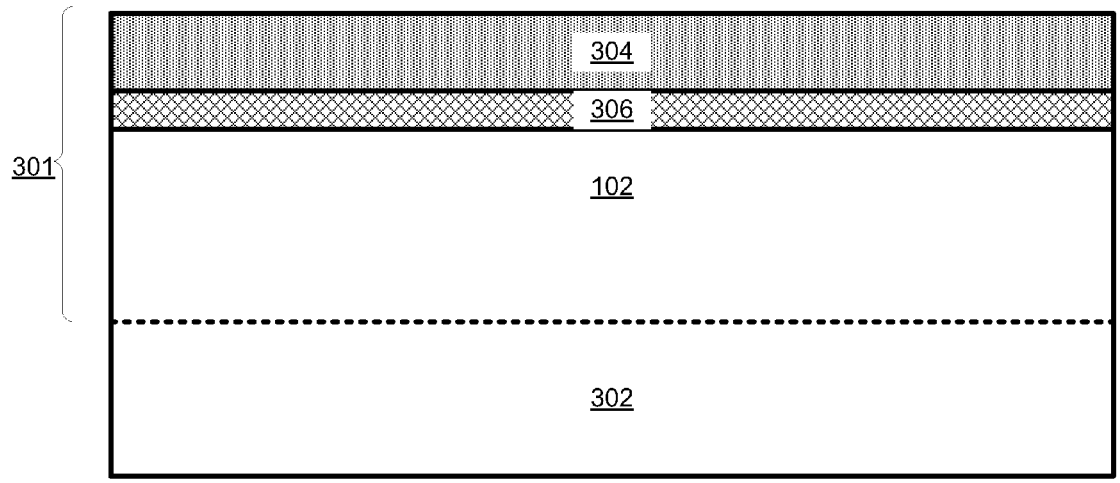
FIGS. 3A and 3B are side views of the memory array in FIG. 1 along cutline A-A and cutline B-B, respectively, prior to performing a FINFET recess process.
Figure 3B:
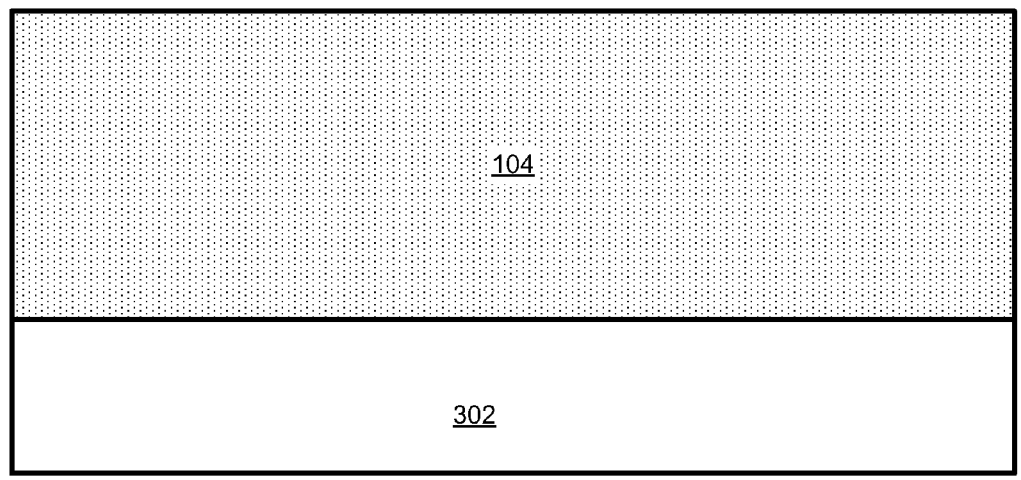

Method 200 begins at block 202 and proceeds to block 204. At block 204, a substrate 302 is provided with a FINFET memory array active area structures formed thereon prior to recess etch. Views of such a substrate are shown in FIGS. 3A and 3B. FIGS. 3A and 3B are side views of the memory array in FIG. 1 along cutline A-A and cutline B-B, respectively, prior to performing the FINFET recess process. In FIGS. 3A and 3B, out of plane boundaries or features are designated by dotted and/or dashed lines.

As shown in FIGS. 3A and 3B, a substrate 302 with a semiconducting surface and masking layers 304 and 306 formed thereon is provided. In the various embodiments of the invention, the substrate can be processed such that portions of layers 304 and 306 and substrate 302 are used to form coextending fin-type projections 301 comprising fin-type active areas 102 and portions of masking layers 304 and 306 thereon, as shown in FIG. 3A. Between the fin-type projections 301 and over substrate 302, dielectric isolation regions 104 are formed, as shown in FIG. 3B. In some embodiments, the process can include processing to provide planarization (i.e., configuring dielectric regions 104 to have substantially the same height as the fin-type projections 301).

In some embodiments of the invention, the fin-type projections 301 can be formed by a combination of photolithographic processes and etch processes. As used herein, photolithographic processes can include one or more steps for forming patterns in photosensitive material. These steps can include wafer cleaning, barrier layer formation, photoresist application, soft baking, mask alignment, exposure and development, and hard-baking However, the various embodiments of the invention are not limited in this regard and other photolithographic processes can include more or less steps than those listed above. In the various embodiments of the invention, dry etch processes, wet etch processes, or any combination thereof can be used to transfer the photoresist pattern into the masking layers and expose the semiconductor substrate underneath. Such etch processes can also one or more dry and/or wet cleaning steps before or after the removal of material. Thereafter, a dielectric material can be grown or deposited between the fin-type projections 301 to form dielectric isolation regions 104.

In other embodiments of the invention, active areas 102 can be formed using local oxidation of silicon (LOCOS) processes. In such a process, rather than patterning and etching masking layers 304, 306, and substrate 302 to form fin-type projections 301 directly, masking layers 304 and 306 are patterned to define a mask for areas for silicon oxide growth. Thus, a dielectric isolation material can be formed in the exposed portions of substrate 302 using a wet or dry oxidation process. As a result, the oxide growth process concurrently defines the dielectric isolation materials 304 and the fin-type projections 301 without the need to etch substrate 302.

In the various embodiments of the invention, the subsequent planarization process can be performed using various methods, such as a mechanical polishing processes, chemical mechanical polishing (CMP) process, or any other processes that can be used to remove excess isolation dielectric material to provide the structure shown in FIGS. 3A and 3B.

Figure 4A:
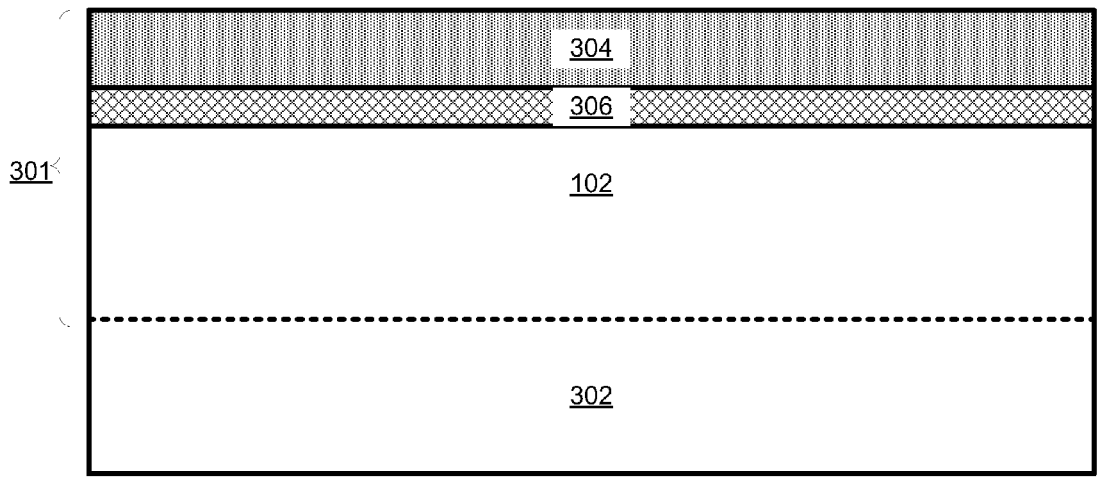
FIGS. 4A and 4B are side views of the memory array in FIG. 1 along cutline A-A and cutline B-B, respectively, after a FINFET recess etch process.
Figure 4B:
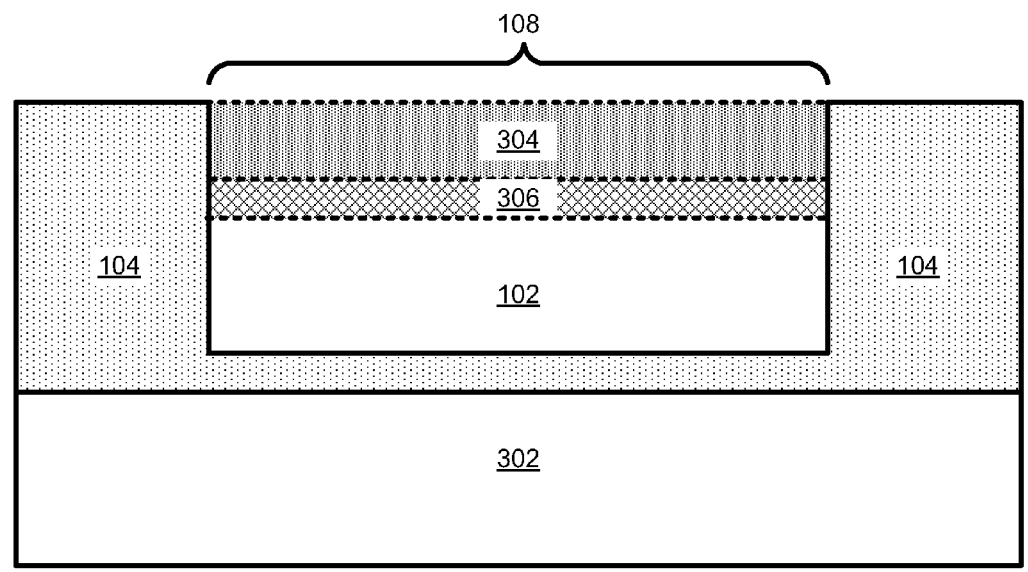

The substrate 302 provided in step 204 can then be processed to form a memory array in accordance with an embodiment of the invention. First, a selective recess process is performed at step 206 to form recesses 108 in dielectric isolation areas 104. That is, the recess process is performed in only selected portions of the memory array. The result of this process is shown in FIGS. 4A and 4B. FIGS. 4A and 4B are side views of the memory array in FIG. 1 along cutline A-A and cutline B-B, respectively, after performing the FINFET recess process. In FIGS. 4A and 4B, out of plane boundaries or features are designated by dotted and/or dashed lines.

At step 206, a combination of photolithography and etch or other removal process is used to reduce the height of dielectric isolation materials 104 in the memory cell region of the memory array 100 (i.e., the region in which memory cell devices will be formed) and form recesses 108, as shown in FIG. 4B. In such processes, photoresist and/or other masking layers can be used to define the locations of recesses 108. Thereafter, an etch process that is selective to the isolation dielectric material can be used to form recesses without significantly affecting the dimensions of the fin-type projections 301. In the various embodiments of the invention, dry etch processes, wet etch processes, or any combination thereof can be used to etch dielectric isolation materials.

Figure 5A:
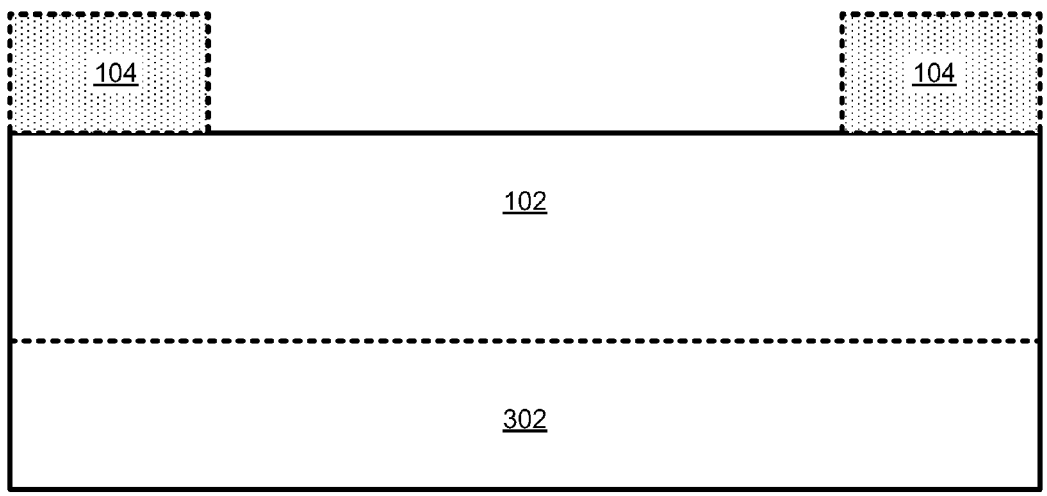
FIGS. 5A and 5B are side views of the memory array in FIG. 1 along cutline A-A and cutline B-B, respectively, after a masking layer strip process.
Figure 5B:
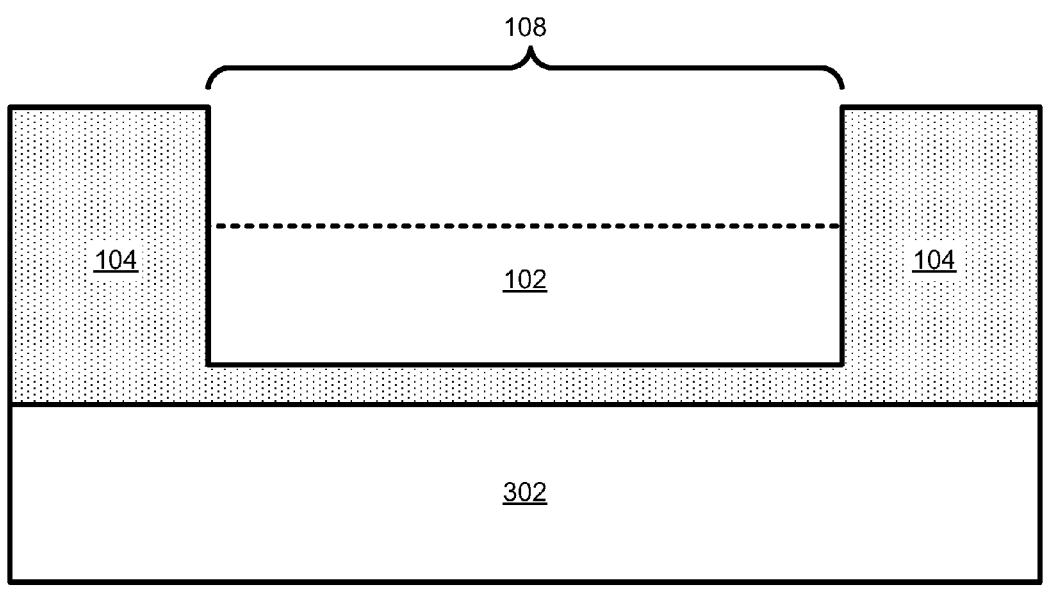

Once the recess process for the memory cell regions is completed at step 206, fabrication of the memory array can be completed starting with step 208. First, the remaining portions of masking layers 304 and 306 can be removed. The resulting structure is shown in FIGS. 5A and 5B. FIGS. 5A and 5B are side views of the memory array in FIG. 1 along cutline A-A and cutline B-B, respectively, after a masking layer strip process. In FIGS. 5A and 5B, out of plane boundaries or features are designated by dotted and/or dashed lines.

As a result of removal of the masking layers 304 and 306, the top of the fin-type active areas 102 is exposed, as shown in FIG. 5A. Further, as a result of the recess etch process at step 206, portions of fin-type active areas 102 adjacent to recesses 108, the sidewall portions of the fin-type active areas 102, are also exposed, as shown in FIG. 5B. In contrast, other portions of fin-type active areas 102, such as the sidewall portions of the fin-type active areas 102 remained covered by portions dielectric isolation regions, as shown in FIG. 5B. In these areas, a planar active area is provided.

Figure 6A:
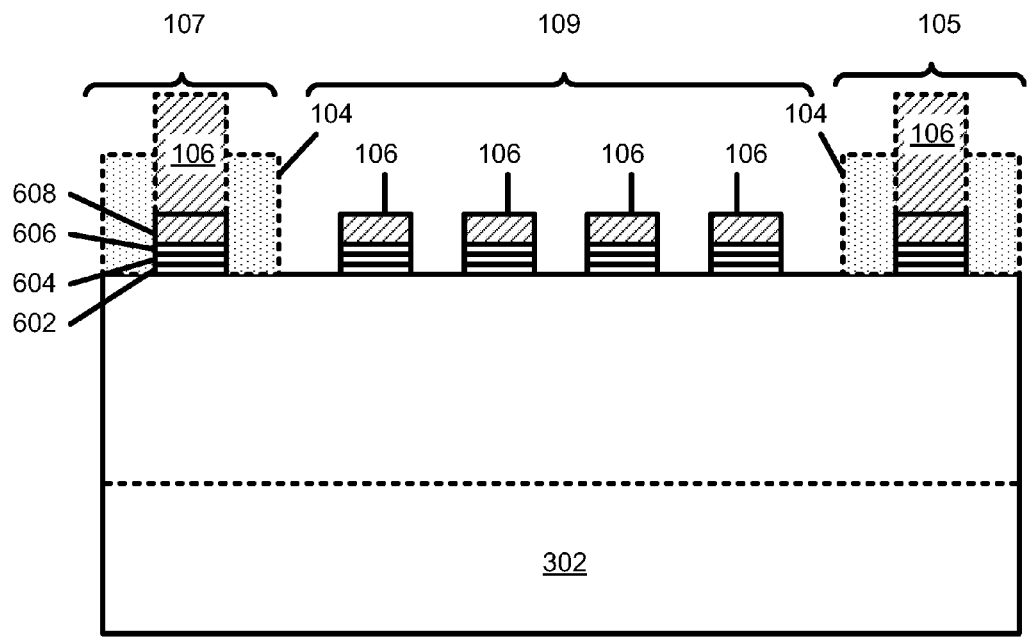
FIGS. 6A and 6B are side views of the memory array in FIG. 1 along cutline A-A and cutline B-B, respectively, after a gate formation process.
Figure 6B:
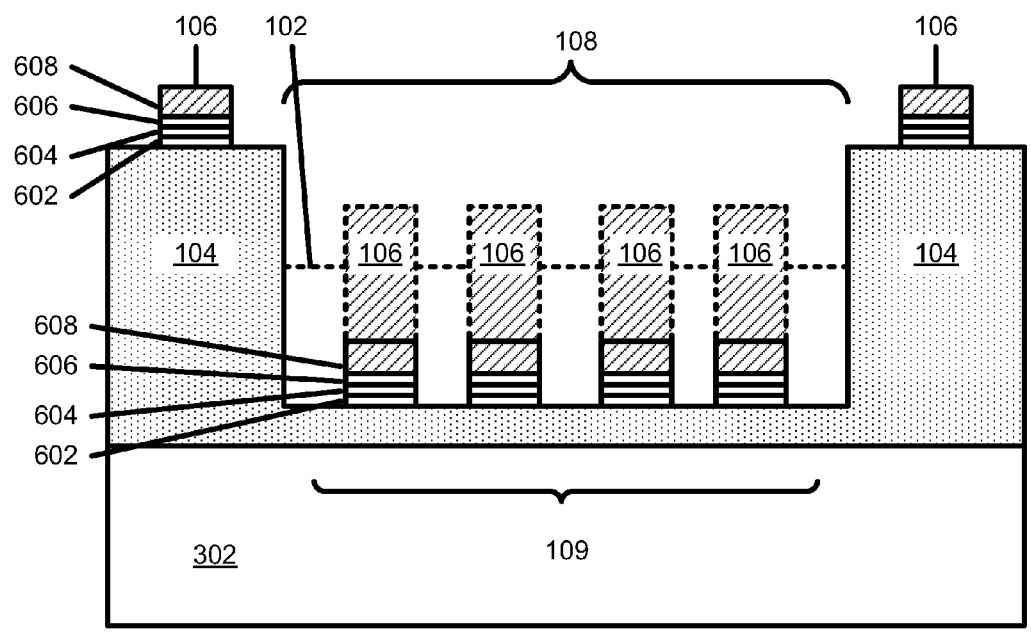

Once the masking layers have been removed in step 208, the gate features 106 for the memory cells and select devices can be formed at steps 210 and 212 to form the structures in FIGS. 6A and 6B. FIGS. 6A and 6B are side views of the memory array in FIG. 1 along cutline A-A and cutline B-B, respectively, after a gate formation process. In FIGS. 6A and 6B, out of plane boundaries or features are designated by dotted and/or dashed lines.

First, at step 210, gate layers for forming the gate features 106 are formed. The gate layers can comprise a tunnel oxide layer 602, a charge trapping layer 604, a control gate dielectric layer 606, and a control gate electrode layer 608. In method 200, the tunnel oxide layer 602 can first be formed over the exposed portions of active areas 102. Thereafter, the charge trapping layer 604 is deposited on substrate 302. After the charge trapping layer 604 is formed, a control gate dielectric layer 606 can be formed thereon using a growth or deposition method. Thereafter, a control gate electrode layer 608 can be formed on the control gate dielectric layer 606.

In some embodiments, the charge trapping layer 604, as deposited, can extend over tunnel oxide layer 602 and over the exposed portions of dielectric isolation regions 104. Therefore, formation of gate layers at step 210 can also include removal of the portions of charge trapping layer 604 over the dielectric isolation regions 104. Additionally, portions of the charge trapping layer 604 can also be removed from any portions of active areas 102 that will not be used to form memory cells 109, such a portions of active areas 102 for forming select gates 105 and 107. In the various embodiments of the invention, portions of the charge trapping layer 604 can be removed using a combination of photolithographic and etch processes. In some cases, the etch process can result in the removal of some portion of the dielectric isolation regions 104. Accordingly, the initial height of the dielectric isolation regions 104 prior to such etch processes is selected such the final height still results in sidewalls of the active region 102 not being exposed.

Once the gate layers 602-608 are formed at step 210, these layers can be processed at step 212 to form the gate control features 106. For example, a combination of photolithographic and etch processes can be used to process gate layers 602-608 to form select lines SGD and SGS and to form wordlines WL0-WL3. As a result, the structure shown in FIGS. 6A and 6B is provided. As shown in FIGS. 6A and 6B, two type of devices are formed in memory array 100. First, in regions of active areas 102 adjacent to recesses 108, the gate features 106 extend over the top and sidewalls of active areas 102 to form FINFET memory cell devices 109, as shown in FIGS. 6A and 6B. Second in other regions of active areas 102 the gate features extend over the top of active areas 102 and over isolation regions 104 to form planar select gate devices 105 and 107, as shown in 6A. Afterwards, method 200 proceeds to block 218 to resume additional processing of substrate, including implantation of ion species, the formation of other layers and/or processing within or outside memory array 100.

In the exemplary process illustrated in FIGS. 3A-6B, the gate features for select gate devices and memory cell devices are formed concurrently. However, the various embodiments of the invention are not limited in this regard. In some embodiments of the invention, a first process can be used to form gate features 106 in memory cell area 109. Thereafter, a second process can be performed to form gate features 106 for areas 105 and 107. Further, the gate features in areas 105, 107, and 109 can be formed using different thickness of layers, different compositions for layers therein, different doping concentrations, and or different ion species.

Figure 7:
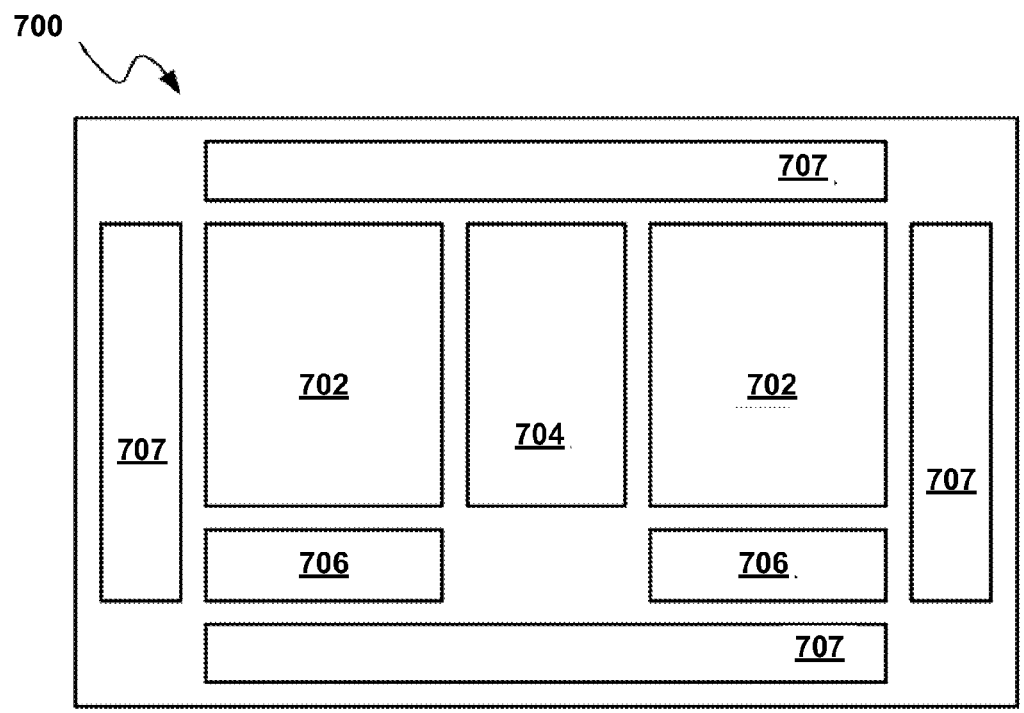
FIG. 7 is a plan view of an electronic device in accordance with an embodiment of the invention.

Referring now to FIG. 7, therein is shown a plan view of a device 700 in accordance with an embodiment of the invention. The device 700 is an electronic device including one or more memory system cell systems 702 and other components 704-708. The various components of device 700 can be formed on a same substrate or housing. However the various embodiments of the invention are not limited in this regard.

The memory cell systems 702 can include individually addressable, substantially identical memory arrays, such as memory array 100 of FIG. 1. The other components 704-708 can include input/output (I/O) circuitry and programming circuitry for individually and selectively addressing the memory cell system 702. For example, the programming circuitry can include one or more x-decoders 704 and y-decoders 706, cooperating with I/O circuitry 708 for connecting to memory cells and effecting designated operations on the memory cells. For example, such operations can include programming, reading, and erasing, and deriving necessary voltages to effect such operations.

For illustrative purposes, the device 700 is shown as a memory device, although it is understood that the device 700 may other semiconductor devices having other functional blocks, such as a digital logic block, a processor, or other types of memories. In some embodiments of the invention, the device 700 can be as single semiconductor device. However, the invention is not limited in this regard. For example, in other embodiments of the invention, the device 700 can be a multichip module with other types of devices of similar or different semiconductor technologies, such as power devices or microelectromechanical systems (MEMS). In yet other embodiments of the invention, the device 700 may be a board level (i.e., formed on a printed circuit board) electronic device including a memory array in accordance with the various embodiments of the invention.

Figure 8:
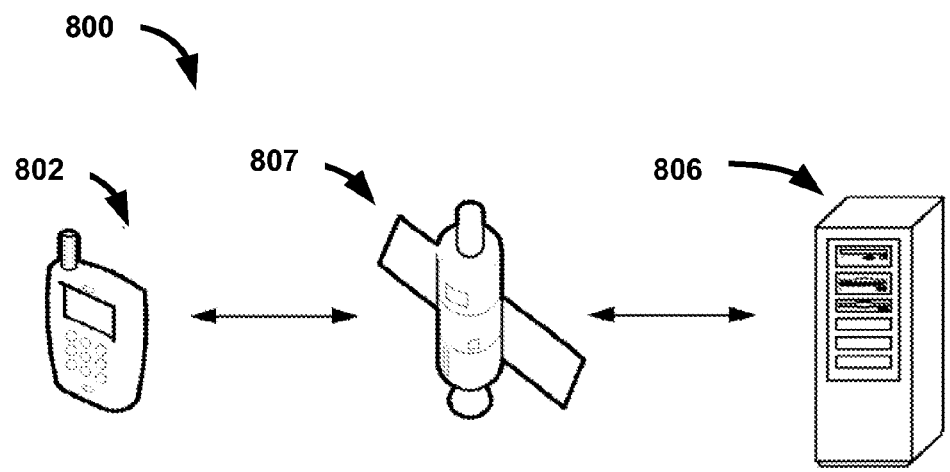
FIG. 8 shows an exemplary electronic system in accordance with an embodiment of the invention.

Referring now to FIG. 8, therein is shown an exemplary electronic system 800 in accordance with an embodiment of the invention. A mobile or non-mobile terrestrial based communications device 802, an airborne or space borne communications device 804, and a computing system 806 are examples of the electronic systems 800 using memory arrays in accordance with the various embodiments of the invention. In particular, the electronic system 800 may be any electronic devices or systems that perform any function for the creation, transportation, storage, and consumption of information. For example, the terrestrial communications device 802 may create information by transmitting data to the spaceborne communications device 804. The communications device 804 can then transport the information to the computing system 806. The computing system 806 may be used to store the information. The terrestrial communications device 802 may also consume information sent from the spaceborne communications device 804.

Although the invention has been illustrated and described with respect to one or more implementations, equivalent alterations and modifications will occur to others having ordinary skill in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. An electronic device, comprising:
    a substrate comprising a semiconducting layer, said semiconducting layer further comprising a plurality of fin-type projections laterally coextending in a first direction through a memory cell region of said substrate and select gate regions of said substrate abutting said memory cell region;
    a dielectric isolation material disposed 1n spaces between said plurality of fin-type projections, said dielectric isolation material in said memory cell regions having a height less than a height of plurality of fin-type projections in said memory cell regions, and said dielectric isolation material in said abutting select gate regions having a height greater than or equal to than a height of said plurality of fin-type projections in said abutting select gate regions;
    a plurality of gate features disposed on said substrate within said memory cell region and said abutting select gate regions over said plurality of projections and said dielectric isolation material, said plurality of gate features coextending in a second direction transverse to said first direction.

2. The device of claim 1, wherein said portion of said plurality of gate features in said memory cell and said plurality of gate features in said abutting select gate regions are configured to have at least one of a different width and a different pitch.

3. The device of claim 1, Wherein said portion of said plurality of gate features in said memory cell have a first pitch and said plurality of gate features in said abutting select gate regions to have second pitch greater than said first pitch.

4. The device of claim 1, wherein said portion of said plurality of gate features in said memory cell have a first linewidth and said plurality of gate features in said abutting select gate regions to have second linewidth greater than said first linewidth.

5. The device of claim 1, further comprising:
a control element communicatively coupled to said plurality of gate features to provide a memory system; and
an electronic system coupled to said memory system.

6. An integrated circuit, comprising:
a substrate comprising a semiconducting surface; and
a NAND-type memory array formed on or in said semiconducting surface, said memory array comprising a plurality of memory cell devices formed in memory cell regions of said memory array and a plurality of select gate devices formed in select gate regions of said memory array abutting said memory cell regions, wherein said plurality of memory cell devices comprising fin-type transistor devices and said plurality of select gate devices comprising planar transistor devices.

7. In the integrated circuit of claim 6, wherein said memory array further comprises:
a first plurality of fin-type projections laterally coextending in a first direction through a memory cell region of said substrate and select gate regions of said substrate abutting said memory cell region; and
a dielectric isolation material disposed in spaces between said first and said second plurality of fin-type projections, said dielectric isolation material in said memory cell regions having a height less than a height of said fin-type projections in said memory ceil regions to define said plurality of memory cell devices, and said dielectric isolation material in said abutting select gate regions having a height greater than or equal to than a height of said fin-type projections in said abutting select gate regions to define said plurality of select gate devices.

8. The integrated circuit of claim 6, wherein a plurality of gate features for said plurality of memory cell devices and a plurality of gate features for said plurality of select gate devices are configured to have at least one of a different width and a different pitch.

9. The integrated circuit of claim 6, wherein a plurality of gate features for said plurality of memory cell devices have a first pitch and a plurality of gate features for said plurality of select gate devices have a second pitch greater than said first pitch.

10. The integrated circuit of claim 6, wherein a plurality of gate features for said plurality of memory cell devices have a first linewidth and a plurality of gate features for said plurality of select gate devices have a second linewidth greater than said first linewidth.

11. The device of claim 6, further comprising:
a control element region formed on or in said semiconductor surface, and communicatively couple to said NAND-type memory array to form a memory system.

* * * * *

UNITED STATES PATENT AND TRADEMARK OFFICE
CERTIFICATE OF CORRECTION

PATENT NO. : 8,598,646 B2
APPLICATION NO. : 13/006339
DATED : December 3, 2013
INVENTOR(S) : Chen et al.

It is certified that error appears in the above-identified patent and that said Letters Patent is hereby corrected as shown below:

In the Claims:

Claim 1, column 8, line 53, "1n" should read --in--; and

Claim 7, column 10, line 7, "ceil" should read --cell--.

Signed and Sealed this
Twentieth Day of May, 2014

Michelle K. Lee
*Deputy Director of the United States Patent and Trademark Office*